(12) United States Patent
Suga

(10) Patent No.: US 6,184,697 B1
(45) Date of Patent: *Feb. 6, 2001

(54) SEMICONDUCTOR INTEGRATED CIRCUIT TESTING APPARATUS WITH REDUCED INSTALLATION AREA

(75) Inventor: Kazunari Suga, Gyoda (JP)

(73) Assignee: Advantest Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/805,140

(22) Filed: Feb. 24, 1997

(30) Foreign Application Priority Data

Feb. 27, 1996 (JP) .................................... 8-039758

(51) Int. Cl.⁷ ...................................... G01R 1/04
(52) U.S. Cl. ........................... 324/754; 324/765
(58) Field of Search .................... 324/765, 757, 324/755, 158.1, 73.1; 414/416, 225, 936, 937; 257/40, 48; 438/14, 17, 18

(56) References Cited

U.S. PATENT DOCUMENTS 5,479,108 * 12/1995 Cheng .................................. 324/765
5,510,724 * 4/1996 Itoyama et al. ...................... 324/758

FOREIGN PATENT DOCUMENTS 44 44 185 A1   9/1995 (DE) .
5-160214       6/1993 (JP) .

* cited by examiner

Primary Examiner—Safet Metjahic
(74) Attorney, Agent, or Firm—Staas & Halsey LLP

(57) ABSTRACT

A main frame of an IC testing apparatus is formed in the shape of a horizontally elongated box with its height close to the height of wafer probers. Two wafer probers are arranged side by side transversely of the main frame on the front said thereof. One rotary drive is equipped with two output shafts which are connected via respective clutches with the rotary drive, and the testing heads are connected to the associated output shafts. The rotary drive is disposed on the top of the main frame with an extension of the upper portion of the rotary drive, and is adapted to rotatively drive the testing heads connected to the output shifts between a fist position opposing the contact section of the associated wafer prober and a second position over the top of the main frame. This construction reduces the installation areas for each of the wafer probers as well as narrowing the space between the wafer probers and the main frame.

11 Claims, 7 Drawing Sheets

SEMICONDUCTOR INTEGRATED CIRCUIT TESTING APPARATUS WITH REDUCED INSTALLATION AREA

BACKGROUND OF THE INVENTION

1. Field of the Invention

The present invention relates to a semiconductor integrated circuit testing apparatus for testing semiconductor integrated circuits (as will be referred to as "IC" hereinafter), particularly ICs which are not received in packages, namely, unpackaged ICs, using an apparatus called "wafer prober", and more particularly to such an IC testing apparatus which is configured so as to be accommodated in a small installation area, so that a number of such IC testing apparatus may be installed in a limited floor area.

2. Description of Related Art

It is required to use an apparatus called wafer prober to test ICs to be shipped in the form of either wafer or chip (in an unpackaged state) which is a semi-finished product among other ICs. As will be described below, the wafer prober is equipped on its top with a contact section with which a testing head of the IC testing apparatus is to be brought into contact, and probes adapted to contact with the contact section are disposed within the prober.

The wafer prober transports an IC to be tested in the form of either wafer or chip to a position where the terminals (leads) of the IC comes into contact with the corresponding probes. During the testing operation for ICs to be tested, test signals of a predetermined pattern are sequentially supplied to the testing head of the IC testing apparatus from its IC tester part. The test signals are in turn supplied to the contact section of the wafer prober through a contact means provided in the testing head, and then are applied to the IC under test transported to the above-mentioned position through the probes located beneath the contact section. The response signals from the IC under test are provided to the IC tester part via the reverse path opposite to that described just above. In this manner the testing is conducted on ICs in the form of either wafer or chip.

An example of the construction of the conventional IC testing apparatus of such type will be described with reference to FIGS. 6 and 7. The illustrated IC testing apparatus comprises two wafer probers 10, two rotary drive means 30, each positioned adjacent the associated wafer prober, two testing heads 20, each pivotally or swingably mounted to the associated rotary drive means 30, and a main frame 40 in the shape of a vertically elongated box. While the main frame 40 comprises a cabinet, it is commonly called main frame in the art concerned, and will therefore be referred to as such hereinbelow. Accommodated within the main frame 40 is an IC tester part for generating test signals of a predetermined pattern, address signals, etc. to be applied to ICs to be tested in the wafer prober 10 and for receiving and processing response signals from the ICs under test to measure their electrical characteristics.

The wafer prober 10 has therewithin an automatic transporting apparatus for transporting and handling unpackaged ICs such as ICs in the form of either wafer or chip, and probes adapted to contact with the terminals (leads) of an IC to be tested when the IC is transported in position by the automatic transporting apparatus, whereby the terminals of the IC are presented out through these probes to a contact section 11 comprising a plurality of contact elements located on the top of the wafer prober 10.

The testing head 20 is equipped with a contact means 21 comprising a plurality of contact elements adapted to contact with the contact section 11 located on the top of the wafer prober 10, and is normally in a position where the contact means 21 is in contact with the contact section 11 as shown in solid lines in FIG. 6. With the contact means 21 in contact with the contact section 11, the contact means 21 is directed downwardly and in electrical contact with the contact section 11. Connected with the contact means 21 is a cable, not shown, so that the IC under test is connected with the IC tester part accommodated in the main frame 40 through the probes in the wafer prober 10, the contact section 11, the contact means 21 and the cable to effect the testing of the electrical operation of the IC under test.

The purpose of configuring the testing head 20 so as to be pivotable by the rotary drive means 30 is as follows: During the testing of an IC under test, the testing head 20 is in the position shown in solid lines in FIG. 6 in which it is placed on the contact section 11 of the wafer prober 10 to maintain electrical contact between the IC tester part and the wafer prober 10. When the type of ICs to be tested is to be varied, it may be required to replace the contact section located on the top of the wafer prober 10 and the contact means 21 of the testing head 20, depending on the variation in the number of the terminals of an IC, etc. In order to facilitate the replacement of the contact section 11 and the contact means 21, the testing head 20 is pivotted by the rotary drive means 30 through approximately 180° to be moved from above the top of the wafer prober 10 to the position shown in dotted lines in FIG. 6 and held in that position. The contact section 11 on the top of the wafer prober 10 is thus exposed to provide easy access for replacement. At the same time, the testing head 20 itself is also 180° inverted in its attitude and hence the exposed surface of the contact means 21 is directed upward to provide easy access for replacement.

As discussed above, in the IC testing apparatus employing the wafer prober 10, the arrangement is made for moving the testing head 20 away from the top of the wafer prober 10 while turning the testing head 20 over by the rotary drive means 30 for the purpose of permitting the replacement of the contact section 11 located on the top of the wafer prober 1C as well as the contact means 21 of the testing head 20. In order to provide for pivotal movement of the testing head 20, some space required for carrying out the operation of replacing the contact means 21 of the testing head 20 must be provided in the position where the contact means 21 faces upward. Such space is illustrated at DS in FIGS. 6 and 7.

The space DS is an utterly void area and a wasteful space during the testing of an IC under test. Hereinafter the wasteful space is called dead space DS. Generally, since two wafer probers 10 are used for one main frame 40, one IC testing apparatus usually involves two wafer probers 10, associated two testing heads 20 and two rotary drive means 30 in conjunction with one main frame 40.

As is apparent from FIG. 7 which is a plan view of the IC testing apparatus shown in FIG. 6, on one side of the main frame 40 there is disposed a desk 50 on which a work station for controlling the IC tester part and the like are to be installed. A floor area of about 5 m in width W and about 4.5 m in depth D as shown in FIG. 7 will be required to install one IC testing apparatus having the arrangement as described above. Hence, if four such IC testing apparatus are to be installed and arranged in the layout shown in FIG. 7, a floor area of about 10 m in width W and about 7 m in depth D will be required.

It can thus be understood that installing a number of IC testing apparatus necessarily involves so many dead spaces DS, requiring a large building having a floor space including such many dead spaces DS, which leads to a substantial increase in economic burden.

SUMMARY OF THE INVENTION

Accordingly, it is an object of the present invention to provide an IC testing apparatus of the type described above which requires a reduced floor area for installation.

In order to accomplish this object, the invention provides an IC testing apparatus in which the main frame for housing the tester part is made lower in height (profile) so that the space over the top of the main frame may be available as an area for either replacing the contact means of the testing head or performing the maintenance work, etc. whereby the need for providing a special space for carrying out either the operation of replacing the contact means of the testing head or the maintenance work etc. is eliminated.

In a preferred embodiment, the main frame for housing the tester part of the IC testing apparatus is made in the shape of a horizontally elongated box and has its height reduced to approximate that of the wafer probers such that either the operation of replacing the contact means of the testing head or the maintenance work etc. may be performed in an area over the top of the main frame. The arrangement is such that only one rotary drive means is required to pivot or swing two testing heads between a first position over the tops of the associated wafer probers and a second position over the top of the main frame.

With the construction according to the present invention, it is to be appreciated that since the area over the top of the main frame which has not been utilized in the prior art is allocated for replacing the contact means disposed on the testing head, the replacement area is no longer a dead space. Moreover, it is possible to lower the profile of the main frame to such a height that the operator may perform the operation of replacing the contact means of the testing head without the need for using any stepladder or foot-stool, so that the replacement and maintenance works may be easily done.

That volume of the main frame reduced by lowering the profile of the main frame may be compensated for by making the shape of the main frame horizontally elongated to take advantage of the lateral spaces which would otherwise be wasteful. It is thus possible to secure a sufficiently large volume equivalent to that of the conventional main frame by making it a horizontally extended housing. This significantly reduces the floor area required for installing one IC testing apparatus comprising two wafer probers, two testing heads, one rotary drive means and one main frame.

In addition, in a preferred embodiment, one rotary drive means is configured to be drivingly connected selectively with either one of two testing heads, whereby the initial cost and space requirements for the rotary drive means may be reduced.

DETAILED DESCRIPTION OF THE PREFERRED EMBODIMENTS

Figure 6:
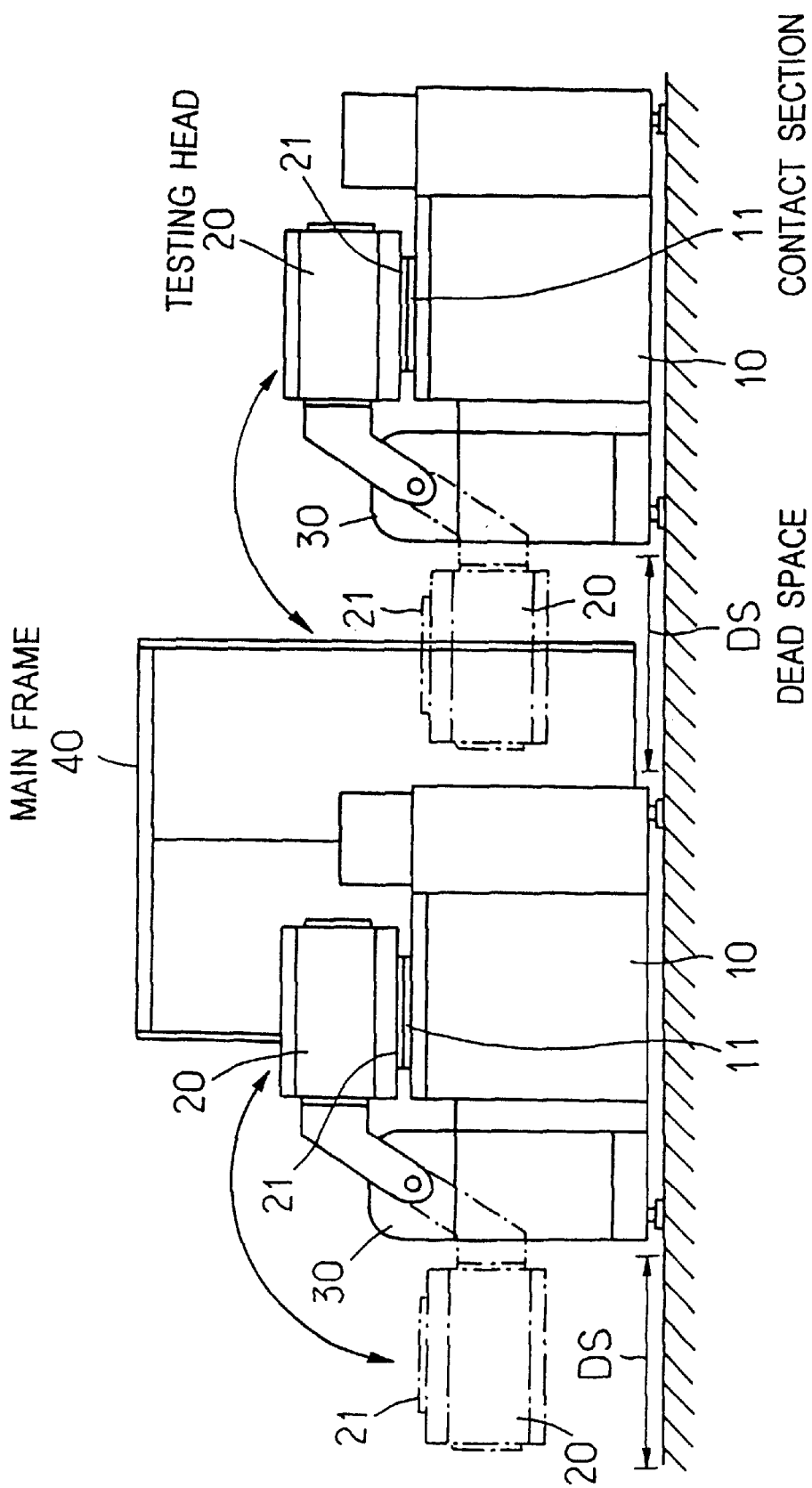
FIG. 6 is a front view illustrating one example of the construction of the conventional IC testing apparatus.
Figure 7:
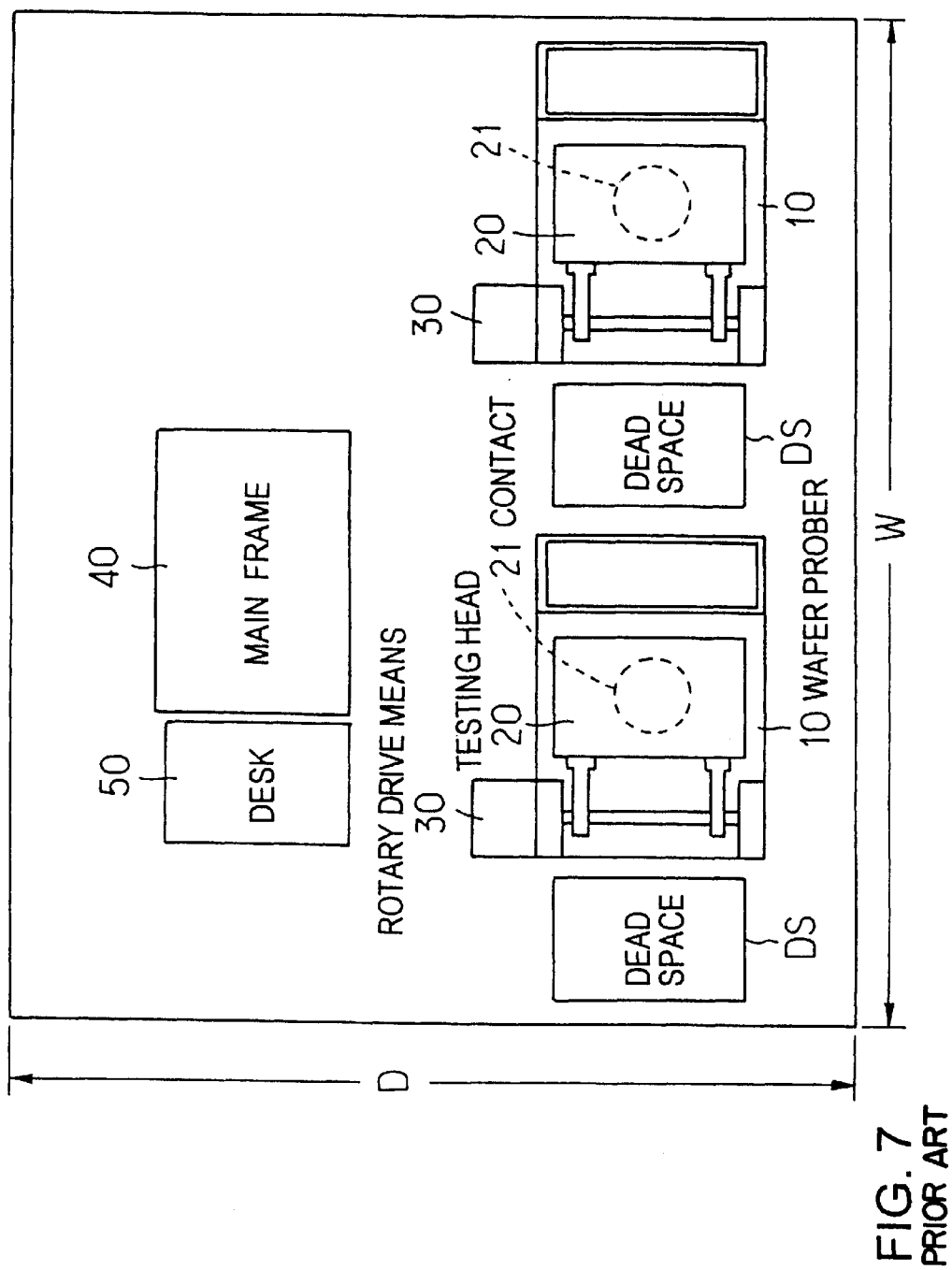
FIG. 7 is a plan view of the IC testing apparatus shown in FIG. 6.

Preferred embodiments of the present invention will be described in details with reference to FIGS. 1 to 4. It should be noted that like reference numerals are used for the components and elements which correspond to those shown in FIGS. 6 and 7, and further description is omitted, unless necessary, for purposes of simplification of the description.

Figure 1:
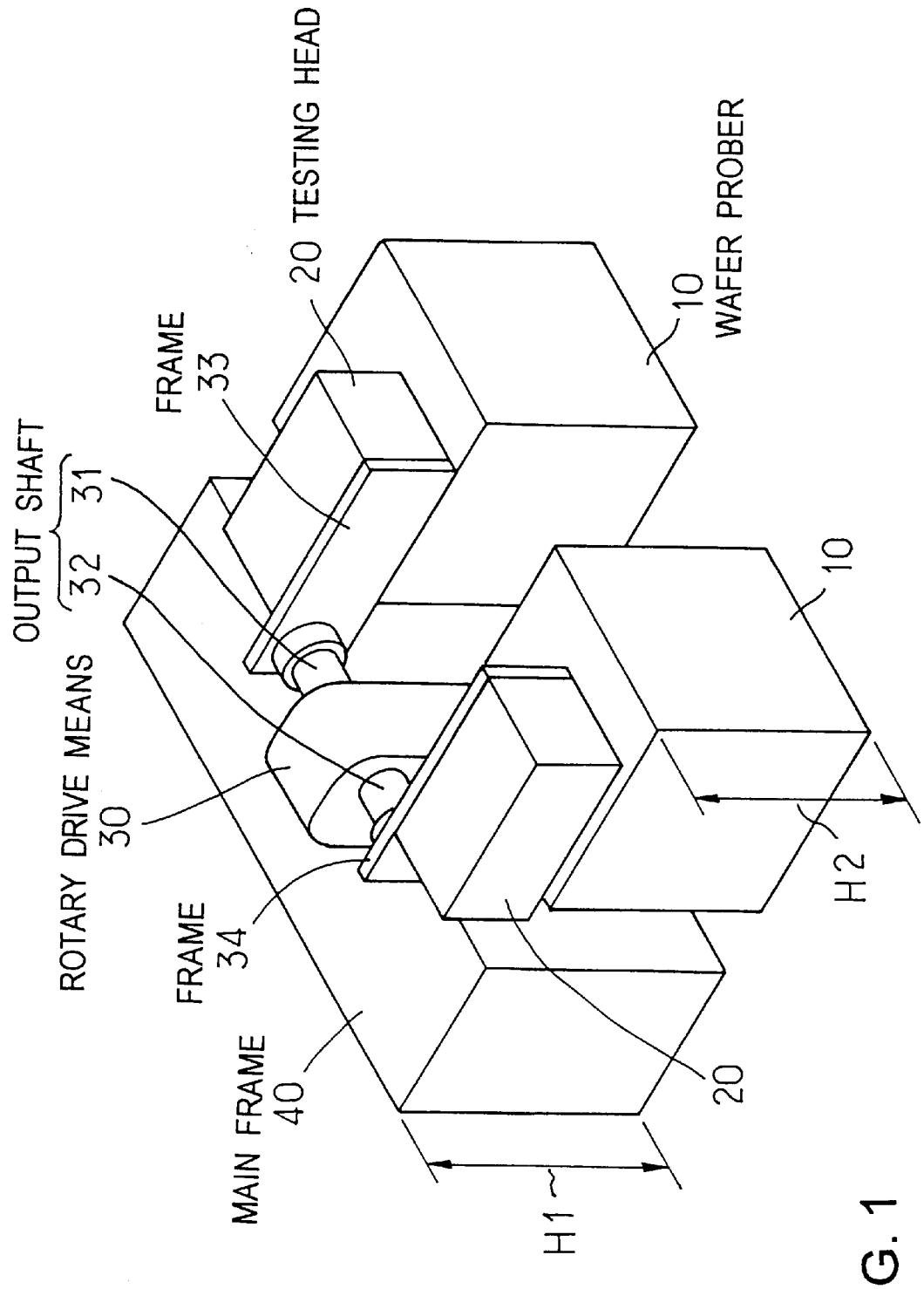
FIG. 1 is a perspective view illustrating one embodiment of the IC testing apparatus according to the present invention.
Figure 2:
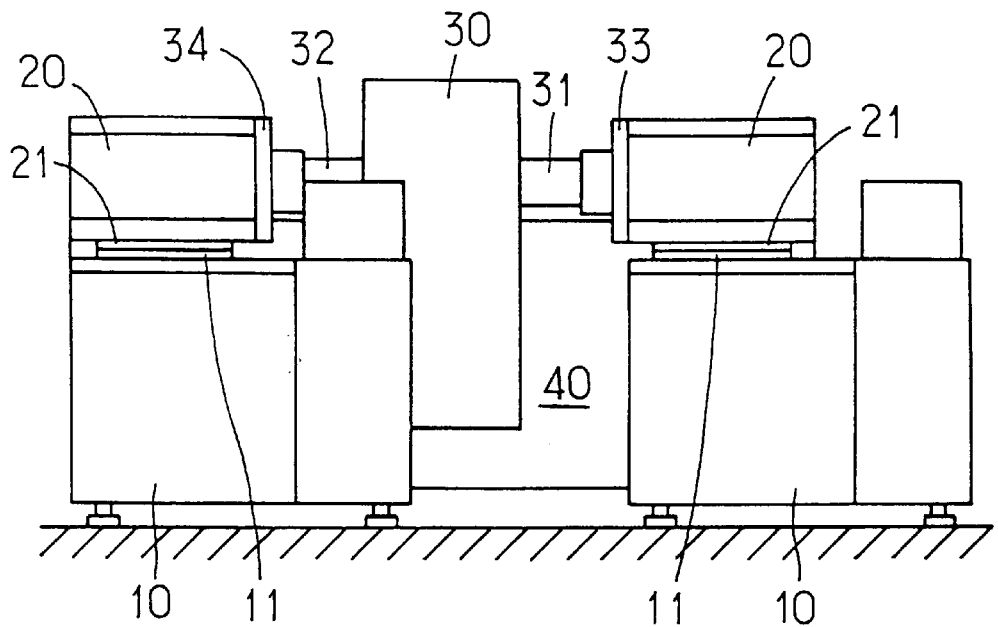
FIG. 2 is a front view of the IC testing apparatus shown in FIG. 1.
Figure 3:
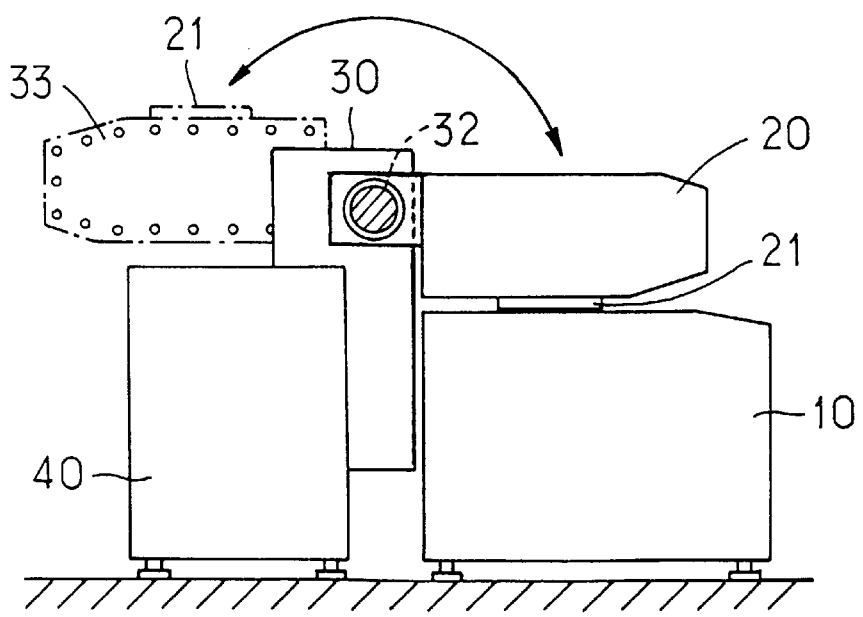
FIG. 3 is a side view taken from the left hand side of the IC testing apparatus shown in FIG. 1 with the output shaft of the rotary drive means shown in cross-section.

FIG. 1 is a perspective view illustrating the construction of one embodiment of the IC testing apparatus according to the present invention, FIG. 2 is a front view of the IC testing apparatus shown in FIG. 1, and FIG. 3 is a side view taken from the left hand side of the IC testing apparatus shown in FIG. 1 with only one 32 of the output shafts of the rotary drive means 30 shown in cross-section. In the illustrated IC testing apparatus, a main frame 40 housing an IC tester part is made in the shape of a horizontally elongated box with the height H1 reduced to approximate the height H2 of each of wafer probers 10. It is seen from FIG. 2 that the width (transverse length) of the main frame 40 is shorter than the transverse distance between the opposite outermost ends of the two wafer probers 10 spaced apart a predetermined distance.

In this embodiment, two testing heads 20 are selectively pivotally moved by one rotary drive means 30 between a first position over the tops of the associated wafer probers 10 and a second position over the top of the common main frame 40 in which the replacement of or maintenance work on the contact means 21 mounted on each of the testing heads 20 may be easily performed.

In order to insure that the operator may easily carry out the replacement of or maintenance work on the contact means 21 of each of the testing heads 20, the main frame 40 is formed in the shape of a horizontally elongated box with its height H1 reduced close to the height H2 of each of the wafer probers 10, as indicated above. In the illustrated embodiment, the height H1 of the main frame 40 is selected to be slightly higher than the height H2 of the wafer probers 10 but substantially lower than the level of the top of the testing head 20 in its first position. It should be understood, however, that as long as the main frame 40 has a volume large enough to accommodate the IC tester part, the height H1 of the main frame 40 may be substantially equal to or even lower than the height H2 of the wafer probers 10. It is preferable, however, that the width of the main frame 40 be no longer than the transverse distance between the opposite outermost ends of the two wafer probers 10.

While the transverse width of the main frame 40 is shorter than the transverse distance between the opposite outermost ends of the two wafer probers 10 spaced apart a predetermined distance as stated above, the transverse width of the main frame 40 is selected such that the contact sections 11 of the two wafer probers 10 will install themselves within the transverse width of the main frame 40. With this arrangement, when rotated about 180° by the rotary drive means 30 from the position in abutment with the contact section 11 of the associated wafer prober 10, each of the testing heads 20 is stopped at the position overlying the top of the main frame 40 (see the dotted lines in FIG. 3 and FIG. 4) wherein the testing head 20 is held over the main frame 40 with its contact means 21 facing upward to permit easy replacement of or maintenance work on the contact means 21 of the testing head 20.

In addition, elimination of the need for installing one rotary drive means 30 on one side of each wafer prober 10 permits the spacing between two wafer probers 10 to be narrowed and also reduces the installation area for each wafer prober, which in turn reduces the installation area for the IC testing apparatus.

Furthermore, in this embodiment, the rotary drive means 30 is located on the front side of the main frame 40 (opposing the wafer probers 10) and between two testing heads 20 as viewed from the front, and is equipped with two output shafts 31, 32 extending therefrom in opposite directions which are connected via clutch means with a rotary drive source (motor). The testing heads 20 are connected to the outer ends of the associated output shafts 31, 32. The rotary drive source is adapted to selectively drive the two output shafts 31 and 32. While the output shafts 31, 32 have frames 33, 34 mounted on their outer ends for supporting the associated testing heads 20 in the illustrated example, the present invention is not limited to such construction.

Figure 4:
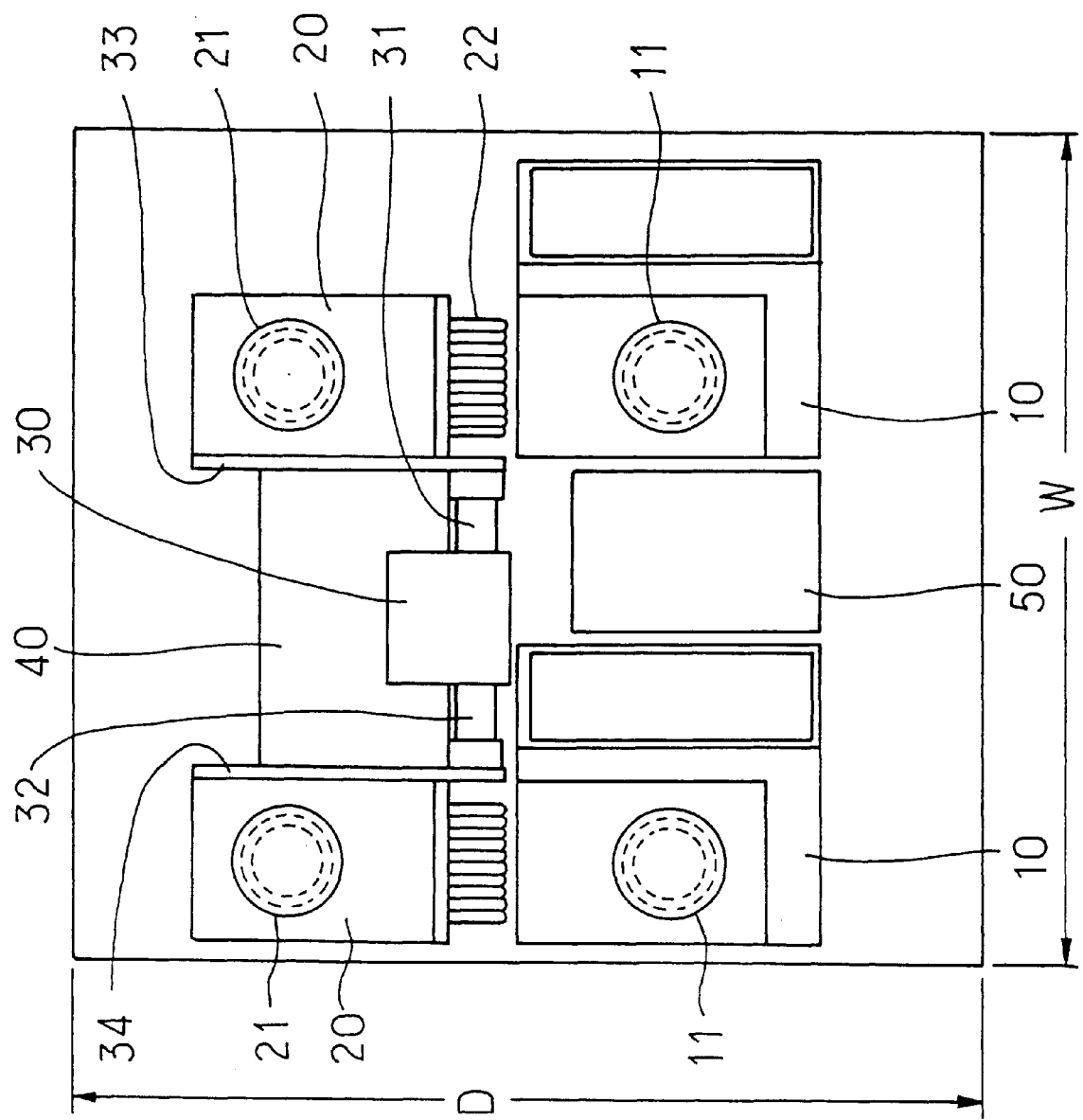
FIG. 4 is a plan view illustrating an alternate embodiment of the IC testing apparatus according to the present invention in which a desk is disposed between two wafer probers, with the wafer probers shown as rotated about 180° from the position in FIG. 1.

FIG. 4 is a plan view illustrating an alternate embodiment of the IC testing apparatus according to the present invention in which a desk 50 for installing a work station controlling the IC tester part or the like is disposed between two wafer probers 10, with the wafer probers shown as rotated about 180° from the position in FIG. 1. While the desk 50 is not necessarily needed, there is an indispensable space between two wafer probers 10, and hence it is advantageous to dispose such desk in the indispensable space with respect to reducing the installation area of the IC testing apparatus in an application requiring such desk as in this embodiment. In FIG. 4 the reference numeral 22 designates cables leading from the testing heads 20.

With two output shafts 31, 32 being adapted to selectively be connected with the rotary drive source through clutch means as described above, the rotary drive source need only have a torque capacity required for rotatively driving one testing head. In other words, the use of a rotary drive source having a capacity required for moving only one testing head is permitted, making it possible to cut down the cost.

Moreover, as will be appreciated from FIGS. 3 and 4, the rear extension of the upper portion of the rotary drive means 30 rotatably bearing two output shafts 31, 32 is configured to rest on the unoccupied top of the main frame 40 so as to reduce the extent of the rotary drive means 30 projecting forward, that is, the rotary drive means 30 is made in an inverted L-shape in a side view so that it may be mounted on the main frame 40 abutting against the top and front surfaces of the latter. This construction not only saves the installation area by the rotary drive means 30 being decreased by one in number, but also reduces the space occupied by one rotary drive means. On top of that, it also allows for narrowing the spacing between the two wafer probers 10 and the adjacent main frame 40 as compared to the conventional arrangement, thereby permitting a great reduction in the installation area for one IC testing apparatus, conjointly with the reduced installation area for each of the wafer probers 10.

In the embodiment described above, if one rotary drive means 30 is adapted to simultaneously rotatively drive two testing heads, it again allows for substantially reducing the installation area for one IC testing apparatus, although the rotary drive means requires an increased torque capacity. Accordingly, it should be understood that the present invention is not limited to the arrangement in which either one of the testing heads is rotatively driven at one time by the rotary drive means.

Figure 5:
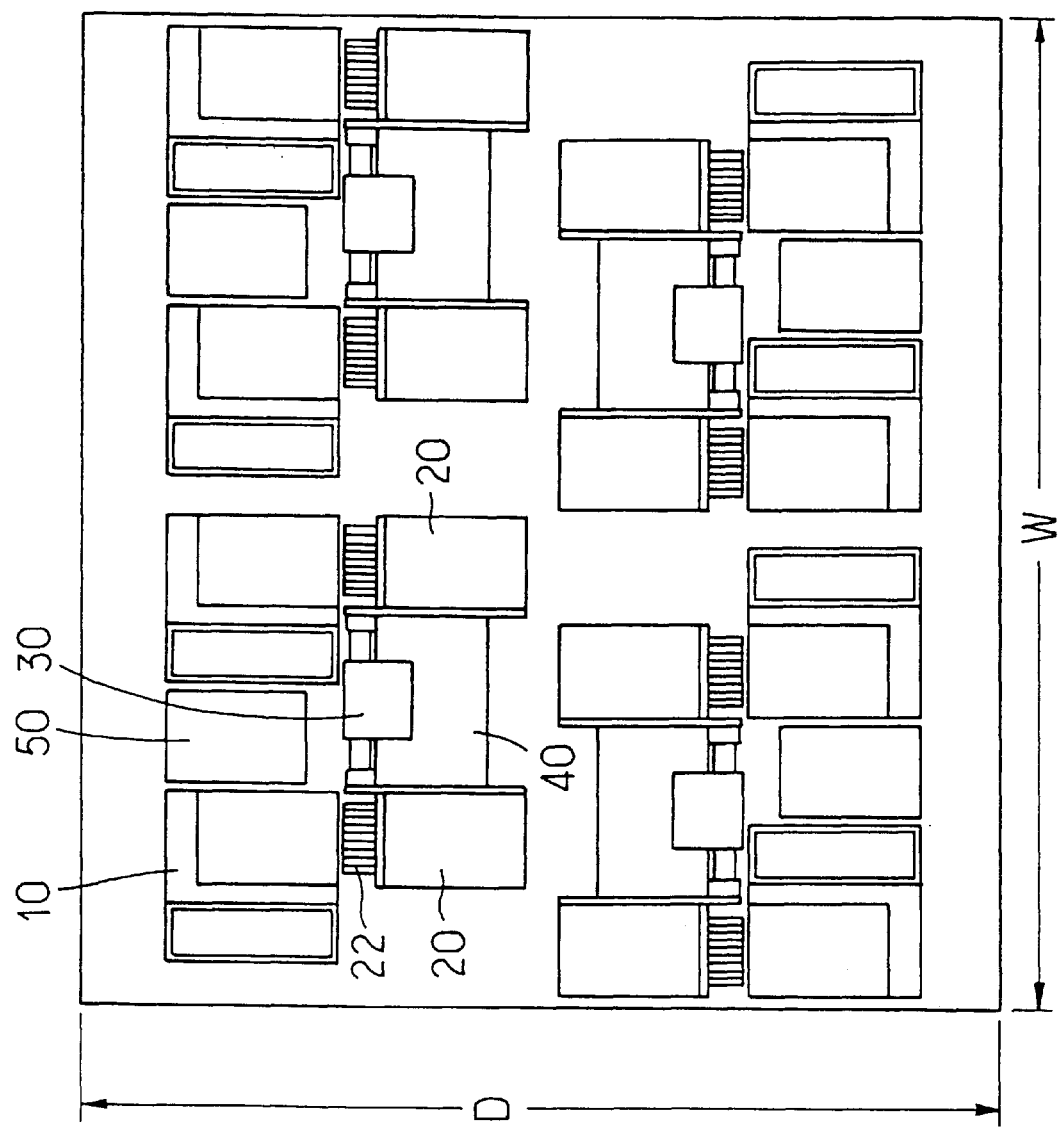
FIG. 5 is a diagrammatical plan view illustrating the floor area occupied when four of the IC testing apparatus shown in FIG. 4 are installed.

It has been found that with reference to FIG. 4, a floor area of about 3 m in width W and about 3.8 m in depth D is sufficient to install one IC testing apparatus constructed as described above according to the present invention. This area is narrower by about 2 m in width W and about 0.7 m in depth D than the area of the conventional example shown in FIG. 7. By way of example, FIG. 5 illustrates how four IC testing apparatus according to the present invention are installed. In this case, a floor area of about 6.4 m in width W and about 6 m in depth D has been found sufficient.

Figure 8:
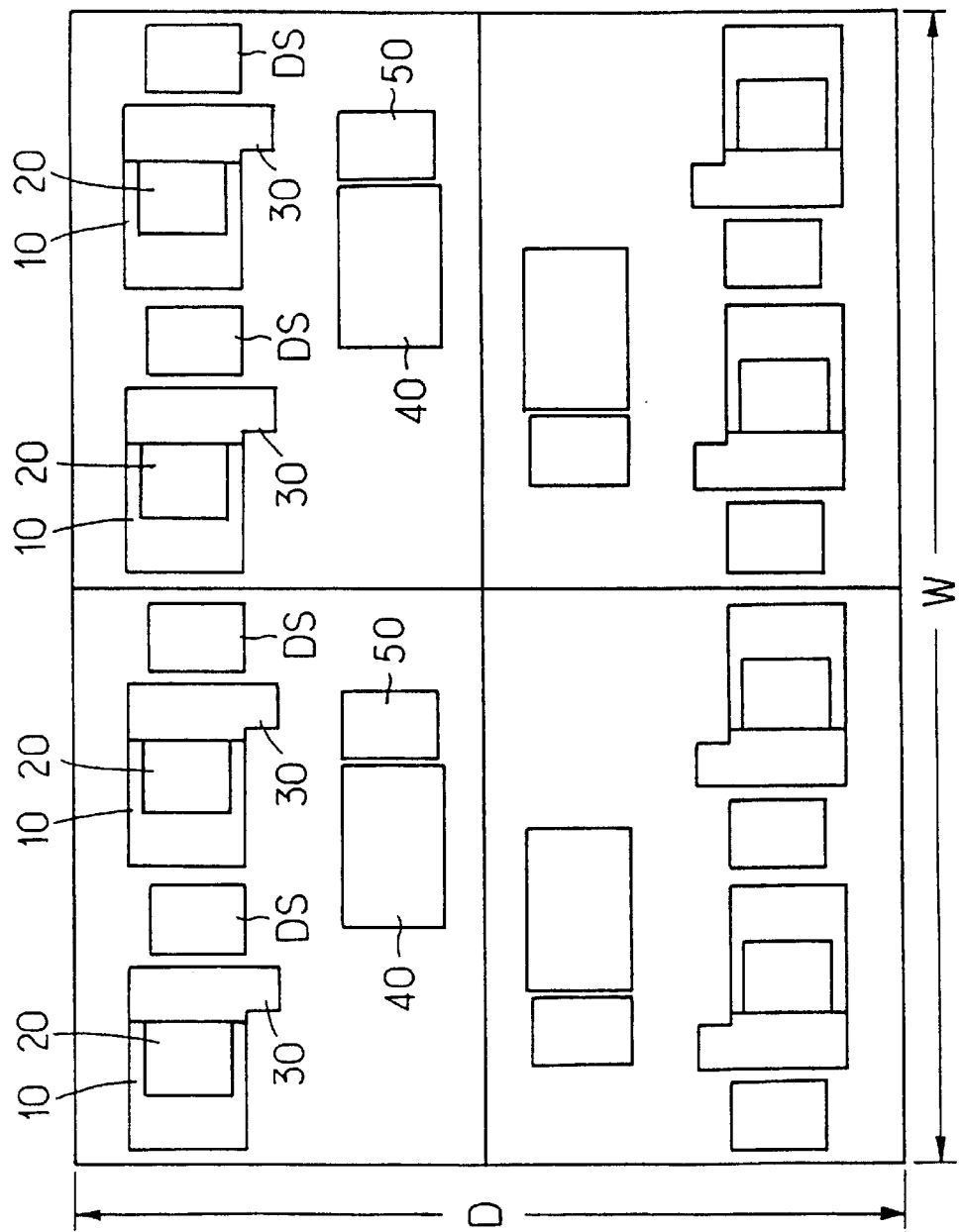
FIG. 8 is a plan view illustrating the arrangement in which four of the IC testing apparatus shown in FIG. 6 are installed.

This means a reduction of about 3.6 m in width W and about 1 m in depth D as compared to the conventional example shown in FIG. 8 in which four IC testing apparatus are installed. From the foregoing it is to be readily appreciated that the IC testing apparatus according to the present invention may be installed in a substantially smaller area.

As stated above, the desk 50 for installing a work station controlling the IC tester part or the like is not necessarily needed for the IC testing apparatus to which the present invention is applied. When no such desk is used, the spacing between the two wafer probers 10 may be further narrowed, so that it may be possible to make the distance between the opposite outermost ends of the two wafer probers 10 equal to or less than the width of the main frame 40 to thereby further reduce the installation area of the IC testing apparatus.

While the IC testing apparatus is illustrated as including one main frame, two wafer probers and two testing heads in the embodiments described above, it is needless to say that the present invention may also reduce the installation area if it is applied to an IC testing apparatus comprising one main frame, one wafer prober and one testing head. It should be understood that the embodiments illustrated and described above are only illustrative and that the present invention is not limited to the particular constructions and arrangements disclosed.

From the foregoing discussion, it will be appreciated that the present invention eliminates the need for providing an extra space for allowing the testing head to be pivotted and held in a position to facilitate the replacement of the contact means by taking advantage of the open space over the top of the existing main frame for that purpose. In addition, the present invention requires only one rotary drive means, resulting in a considerable reduction in the installation area for one IC testing apparatus. Accordingly, when a number of IC testing apparatus are installed, they may be accommodated in a substantially reduced area as compared to the conventional apparatus. It will thus be apparent that the present invention advantageously realizes a considerable cutdown of the cost and enhancement of the cost performance.

Moreover, when two output shafts of one rotary drive means are adapted to be connected through respective clutch means with the associated testing heads, the two testing heads may be driven independently of each other, so that the use of a rotary drive means having a torque capacity required for moving only one testing head is permitted. In this case, additional advantage of cutting down the cost is provided in addition to saving the space.

What is claimed is:

1. An apparatus for testing semiconductor integrated circuits comprising:

a box-shaped main frame housing therein an IC tester part conducting an electrical test on a semiconductor integrated circuit under test;

a testing head including contact means connected through a cable to said IC tester part, said contact means being supported on the testing head in the state that said contact means is exposed on one face of said testing head, said testing head being movable between a first position where the one face of said testing head on which said contact means is exposed faces downward and a second position where said one face of said testing head faces upward;

drive means for moving said testing head between said first and second positions; and a wafer prober disposed adjacent to said main frame and including on a top face thereof a contact section contacting with the contact means of said testing head when the testing head is moved to said first position by said drive means, said contact section of said wafer prober being contacted with terminals of a semiconductor integrated circuit to be tested which is supplied to the contact section, thereby enabling the testing of the semiconductor integrated circuit by said IC tester part, wherein said testing head is above a top of said main frame in such a state that the one face of said testing head on which said contact means is exposed faces upward when the testing head is moved to the second position by said drive means.

2. The apparatus according to claim 1 wherein said drive means is rotary drive means, at least a portion of said rotary drive means being placed on top of said main frame so as to reduce the installation area for said drive means as well as to narrow a space between the wafer prober and said main frame.

3. The apparatus according to claim 2 wherein said portion of said rotary drive means placed on the top of said main frame is a rear extension of an upper portion of the rotary drive means.

4. An apparatus for testing semiconductor integrated circuits comprising:

a horizontally elongated box-shaped main frame housing therein an IC tester part conducting an electrical test on a semiconductor integrated circuit under test;

two testing heads each including contact means connected through an associated cable to said IC tester part, said contact means being supported on the associated testing head in the state that said contact means is exposed on one face of the associated testing head, each of said testing heads being movable between a first position where the one face of the testing head on which said contact means is exposed faces downward and a second position where said one face of the testing head faces upward;

drive means for selectively moving said two testing heads between said respective first and second positions; and two wafer probers disposed adjacent said main frame, each including on a top face thereof a contact section adapted to contact with the contact means of the associated testing head when the associated testing head is moved to said first position, said contact section of each of said wafer probers being in contact with terminals of semiconductor integrated circuit to be tested supplied to each associated wafer prober, thereby to enable the testing of the semiconductor integrated circuit by said IC tester part, wherein:

said two wafer probers are arranged side by side transversely of said main frame such that said respective contact sections of said wafer probers install themselves within a transverse width of said main frame;

said drive means includes two output shafts; and each of said two testing heads is mounted to each of said output shafts and selectively rotated about 180° by the corresponding output shafts so that each of said testing heads is turned over between said first position where each of said testing heads overlies each of the associated connecting sections and said second position where each of said testing heads overlies above a too of said main frame in the state that the one face of the testing head on which said contact means is exposed faces upward.

5. The apparatus according to claim 4 wherein said two wafer probes are arranged side by side transversely of said main frame on a front side of the main frame, said drive means being rotary drive means, at least a portion of said rotary drive means being placed on the top of said main frame so as to reduce the installation areas for said two wafer probes as well as to narrow a space between the wafer probes and said main frame.

6. The apparatus according to claim 5 wherein said rotary drive means is located on the front side of said main frame between said two testing heads as viewed from a front side of the apparatus, and selectively rotates one of the two testing heads between said first position where the contact means of the associated testing head contacts with the contact section of the corresponding wafer prober and said second position where the associated testing head overlies said main frame.

7. The apparatus according to claim 5 wherein said portion of said rotary drive means placed on the top of said main frame is a rear extension of an upper portion of the rotary drive means.

8. The apparatus according to claim 2 wherein a desk is disposed in a space between said two wafer probers.

9. A semiconductor integrated circuits testing apparatus designed to take up less space than earlier such testing apparatuses, said semiconductor integrated circuits testing apparatus comprising:

a box-shaped main frame housing therein an IC tester part conducting an electrical test on a semiconductor integrated circuit to be tested;

a wafer prober disposed adjacent to said main frame and including a contact section which is exposed upward from a top face of said wafer prober;

a testing head including contact means connected through a cable to said IC tester part and exposed outward from one face of said testing head, said testing head being movable between a first position where the contact means of said testing head faces downward and overlies said wafer prober and a second position where the contact means of said testing head faces upward and overlies an outer space out of said wafer prober in a plan view; and rotary drive means including a horizontally mounted shaft to which said testing head is secured for rotating said shaft almost 180°, so that said testing head is moved between said first and second positions;

said contact section of said wafer prober contacting with the contact means of said testing head when the testing head is moved to said first position and contacting with terminals of the semiconductor integrated circuit to be tested which is supplied into said wafer prober, thereby enabling the testing of the semiconductor integrated circuit by said IC tester part, wherein:

said main frame is disposed adjacent to said wafer prober so that a portion of said main frame occupies said outer space;

the testing head is above the top of the main frame when the testing head is in the second position; and said testing head overlies the portion of said main frame in such a state as exposing said contact means upward when it is moved to said second position by said drive means, whereby said outer space is utilized by said main frame effectively.

10. A semiconductor integrated circuits testing apparatus designed to take up less space than earlier such testing apparatuses, said semiconductor integrated circuits testing apparatus comprising:

a box-shaped main frame housing therein an IC tester part conducting an electrical test on a semiconductor integrated circuit to be tested;

a wafer prober disposed adjacent to said main frame and including a contact section which is exposed upward from a top face of said wafer prober, said contact section of said wafer prober contacting with terminals of the semiconductor integrated circuit to be tested which is supplied to said wafer prober;

a testing head including a front face and a rear face opposite to said front face and including contact means connected through a cable to said IC tester part and exposed outward from the front face of said testing head; and means for setting said testing head selectively in a first position where the front face of said testing head faces downward and overlies said wafer prober so as to allow said contact means to contact with the contact section laid thereunder, thereby enabling the testing of the semiconductor integrated circuit by said IC tester part, or in a second position where the front face of said testing head faces upward and the rear face faces downward and overlies an outer space out of said wafer prober in a plan view, thereby enabling said contact means and contact section both positioned apart and facing upwardly to be easily subjected to their maintenance service, respectively, wherein:

said testing head is above the top of the main frame when the testing head is set in the second position by said means for setting;

said main frame is disposed adjacent to said wafer prober in such a manner that a portion of said main frame occupies said outer space, so that said testing head overlies the portion of said main frame when it is set in said second position by said setting means in the state as exposing said contact means upward, whereby said outer space is effectively utilized by occupation by said main frame.

11. A semiconductor integrated circuits testing apparatus designed to take up less space than earlier such testing apparatuses, said semiconductor integrated circuits testing apparatus comprising:

a horizontally elongated box-shaped main frame housing therein an IC tester part conducting an electrical test on a semiconductor integrated circuit to be tested;

two wafer probers disposed adjacent to said main frame and each of said wafer probers including a contact section which is exposed upward from a respective top face of said wafer probers, said contact section of each of said wafer probers being configured to contact with terminals of the semiconductor integrated circuit to be tested which is supplied to said wafer prober;

two testing heads, each of the testing heads including a front face and a rear face opposite to said front face and contact means connected through a cable to said IC tester part and exposed outward from the front face of said testing head; and means for setting each of said testing heads selectively in a first position where the front face of said testing head faces downward and overlies an associated one of said wafer probers so as to allow said contact means of said testing head to contact with the contact section laid thereunder, thereby enabling the testing of the semiconductor integrated circuit by said IC tester part, or in a second position where the front face of said testing head faces upward and the rear face faces downward and overlies an outer space out of said associated one of said one of said wafer probers in a plan view, thereby enabling said contact means and contact section both positioned apart and facing upwardly to be easily subjected to their maintenance service, respectively, wherein:

each of said testing heads is above the top of the main frame when each said testing head is set in the second position by said means for setting;

said main frame is disposed adjacent to said wafer probers in such a manner that a portion of said main frame occupies said outer space, so that said testing heads the portion of said main frame when either of the testing heads are set in said second position by said setting means in the state as exposing said contact means upward, whereby said outer space is effectively utilized by occupation by said main frame.

* * * * *

UNITED STATES PATENT AND TRADEMARK OFFICE
CERTIFICATE OF CORRECTION

PATENT NO. : 6,184,697 B1  
DATED : February 6, 2001  
INVENTOR(S) : Kazunari Suga Page 1 of 1

It is certified that error appears in the above-identified patent and that said Letters Patent is hereby corrected as shown below:

<u>Column 8,</u>  
Line 20, change "too" to -- top --.

Signed and Sealed this

Sixteenth Day of October, 2001

Attest:

*Nicholas P. Godici*

NICHOLAS P. GODICI  
*Attesting Officer*     *Acting Director of the United States Patent and Trademark Office*